United States Patent [19]

Wada

[11] Patent Number: 4,634,955

[45] Date of Patent: Jan. 6, 1987

[54] MALFUNCTION DETECTOR FOR DETECTING OPEN-CIRCUIT CONDITION AT DC GENERATOR OUTPUT TERMINAL

[75] Inventor: Hifumi Wada, Hyogo, Japan

[73] Assignee: Mitsubishi Denki Kabushiki Kaisha, Tokyo, Japan

[21] Appl. No.: 659,476

[22] Filed: Oct. 10, 1984

[30] Foreign Application Priority Data

Oct. 18, 1983 [JP] Japan .................. 58-196566

[51] Int. Cl.$^4$ .................. H02P 9/00; G01R 31/00; H02J 7/14
[52] U.S. Cl. .................. 322/99; 324/158 MG; 361/20
[58] Field of Search .................. 364/550; 322/99, 58, 322/32; 320/64; 324/158 MG; 361/20, 21

[56] References Cited

U.S. PATENT DOCUMENTS

| | | | |
|---|---|---|---|
| 3,305,774 | 2/1967 | Heath | 322/99 X |
| 3,705,331 | 12/1972 | South et al. | 361/20 |
| 4,041,369 | 8/1977 | King et al. | 322/99 |
| 4,178,546 | 12/1979 | Hulls | 322/99 X |
| 4,242,674 | 12/1980 | Wheeler | 322/99 X |
| 4,471,308 | 9/1984 | Gable et al. | 322/99 X |
| 4,528,493 | 7/1985 | Spencer et al. | 322/99 |

FOREIGN PATENT DOCUMENTS

| | | |
|---|---|---|
| 53103 | 6/1982 | European Pat. Off. . |
| 2551683 | 6/1977 | Fed. Rep. of Germany . |
| 2806015 | 2/1979 | Fed. Rep. of Germany . |
| 2549037 | 9/1979 | Fed. Rep. of Germany . |
| 3021204 | 12/1980 | Fed. Rep. of Germany . |
| 3006109 | 8/1981 | Fed. Rep. of Germany . |
| 3027879 | 4/1982 | Fed. Rep. of Germany . |
| 2314800 | 7/1982 | Fed. Rep. of Germany . |

Primary Examiner—R. J. Hickey
Attorney, Agent, or Firm—Sughrue, Mion, Zinn, Macpeak and Seas

[57] ABSTRACT

A malfunction detector for detecting an open-circuit condition at the output terminal of a vehicular DC generator is disclosed. The frequency of a signal derived from one of the armature windings of the generator, for instance, at an end or neutral terminal, is compared with the control frequency of the voltage regulator, which may be derived from a field winding of the generator. If the latter is equal to the former, an indication of an open-circuit condition is given.

4 Claims, 5 Drawing Figures

MALFUNCTION DETECTOR FOR DETECTING OPEN-CIRCUIT CONDITION AT DC GENERATOR OUTPUT TERMINAL

BACKGROUND OF THE INVENTION

The present invention relates to a malfunction detecting device for detecting an open circuit condition at an output terminal of a generator such as a vehicle-mounted DC generator driven by an engine.

If the output terminal of a DC generator is open circuited, the battery cannot be charged by the generator. If the vehicle is continuously driven under such a condition, the battery will be discharged to the point that the engine cannot be started.

Moreover, if the positive battery cable is grounded for any reason, the cable may burn out and there is a danger of fire.

In order to avoid these problems, the open-circuit state of the DC generator output terminal must first be detected. However, there has been no reliable detection device for performing this function previously available.

SUMMARY OF THE INVENTION

Accordingly, the invention provides a malfunction detecting device for reliably detecting the open-circuit condition at the output terminal of a DC generator by comparing the frequency at an end point of one of the armature windings of the DC generator with a control frequency of the voltage regulator.

DESCRIPTION OF THE PREFERRED EMBODIMENTS

Figure 1:
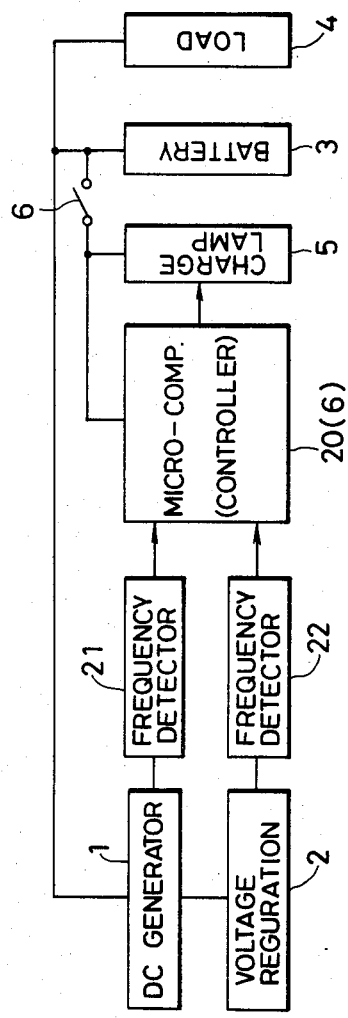
FIG. 1 is a block diagram of a preferred embodiment of a malfunction detector of the present invention.
Figure 2:
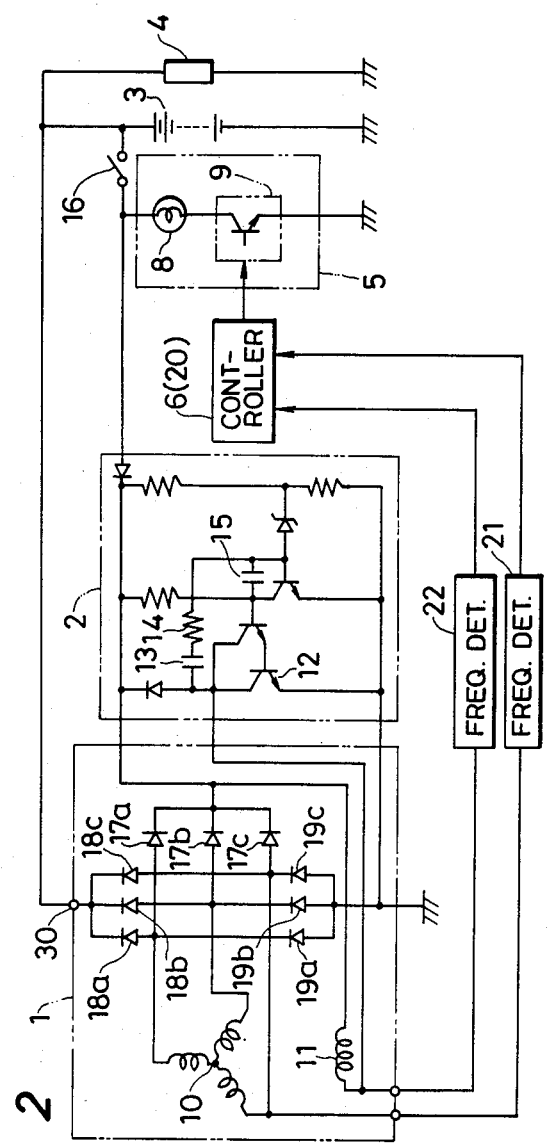
FIG. 2 is a circuit diagram showing the embodiment of FIG. 1 in more detail.

FIG. 1 is a block diagram of a vehicle-mounted charging system to which a preferred embodiment of the invention is applied, and FIG. 2 is a detailed circuit diagram of the charging system shown in FIG. 1.

In FIGS. 1 and 2, the charging system includes a DC generator 1, a voltage regulator 2 connected to a field winding 11 of the DC generator, a battery 3 to be charged by an output of the DC generator 1, a load 4, a charge lamp circuit 5 for indicating malfunctions of the DC generator, and a key switch 16.

The DC generator 1 includes an armature winding 10, the field winding 11, diodes 17a to 17c through which field current is supplied to the field winding 1, and diodes 18a to 18c and 19a to 19c used for three-phase rectification.

The voltage regulator 2 is composed of a switching transistor 12 for on-off switching an energizing current to the field winding 11, a positive feedback circuit including a capacitor 3 and a resistor 14 provided to make the on-off switching of the transistor 12 stable, and a negative feedback circuit through a capacitor 5 provided to eliminate undesirable on-off switching of a charge lamp 8 and a transistor 9.

According to the present invention, a first frequency detector 21 is connected to an end point of a star-connected armature winding. The detector 21 detects the frequency of the voltage at the end point of the armature winding (with respect to ground). A second frequency detector 22 is connected to one end point of the field winding 11 and to the collector of the transistor 12 of the voltage regulator 2 to detect the frequency of the field current. The frequency detectors 21 and 22 have wave-shaping functions.

A controller 6 (FIG. 2) constituted by a microcomputer 20 (FIG. 1) is provided which has two inputs to which frequency-indicating signals produced by the first frequency detector 21 and the second frequency detector 22 are respectively supplied. The microcomputer is provided with operating power by the battery 3 through the key switch 16. An output of the microcomputer 20 is applied to the base of the transistor 9 of the charge lamp circuit 5.

In operation, when the key switch 16 is turned on to connect the battery 3 to the starter motor to start the engine, the controller 6 is also supplied with power from the battery 3. After initialization, the controller 6 performs a step 101 in which it is determined whether there is an output present from the first frequency detector 21. If the engine is not running, the DC generator 1 is not driven, and thus no output is produced by the armature winding 10. Therefore, the controller 6 shifts to a step 102 in which the charge lamp 8 of the charge lamp circuit 5 is lit by turning on the transistor 9.

Then, when the engine is started and a voltage appears across the armature winding 5, the operation of the controller 6 shifts to a step 103. In the step 103, the frequency of the voltage produced across the armature winding 5 as detected by the first frequency detector 21 and which is used as a reference frequency is compared with the frequency of the voltage appearing at one end of the field winding 11 as detected by the second frequency detector 22 and which is used as the control frequency.

Figure 3:
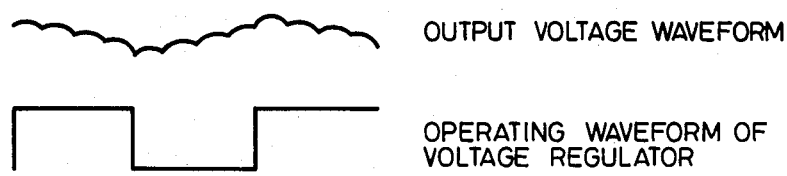
FIG. 3 shows output waveforms of a DC generator in a normal state.
Figure 4:
FIG. 4 is similar to FIG. 3 but shows the same waveforms in an abnormal state.
Figure 5:
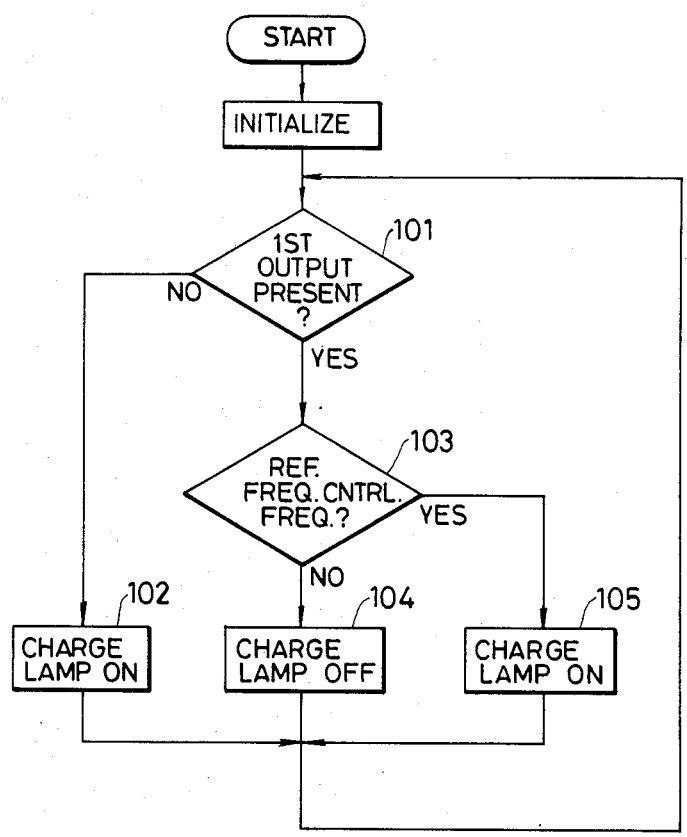
FIG. 5 is a flowchart indicating operations of a controller in FIG. 1.

Since, in this case, the armature winding 5 has the form of star-connected three-phase winding and the voltage produced thereacross is full-wave rectified by the diode bridge, the reference frequency may be six times the control frequency. That is, if the wiring connections are correct, the voltage regulator 2 does not operate at every ripple of the rectified output voltage as shown in FIG. 3 due to the ripple-smoothing action of the battery 3. Thus, the control frequency is lower than the reference frequency.

In this case, the operation of the controller 6 shifts to a step 104 in which a signal is supplied to the base of the transistor 9 of the charge lamp circuit 5 to turn it off and thereby extinguish the charge lamp 8, indicating normal operation of the DC generator 1.

On the other hand, if the output terminal 30 of the DC generator 1 is open circuited, the battery 2 is disconnected from the DC generator 1. Therefore, the ripple-smoothing function of the battery 2 is lost, and therefore the ripple component of the rectified output voltage is larger than normal. Thus, the voltage regulator 2 of the DC generator 1 operates at every ripple of the output voltage of the DC generator 1 and thus the control frequency is then the same as the reference frequency. In this case, the operation of the controller 6 is shifted to a step 105 in which the charge lamp 8 is lit, indicating the open-circuit state of the output terminal 30 of the DC generator 1.

By changing the component values of the positive feedback element and the negative feedback element of the voltage regulator 2, it is possible to vary the operational sensitivity of the voltage regulator 2 with respect to the output voltage waveform of the DC generator 1, and thus it is easily possible to cause the voltage regulator 2 to operate every ripple of the output voltage of the DC generator when the output terminal 30 of the generator is open circuited.

Although in the above-described embodiment the frequency of the voltage at one end of the armature windings of the DC generator is employed as the reference frequency, it is possible to use the frequency of a voltage at the neutral point of the armature windings as the reference frequency. Further, although the charge lamp is used in the described embodiment to indicate the open-circuit state of the output terminal of the DC generator, other indicating devices such as a buzzer or the like can be used for the same purpose.

As described hereinbefore, according to the present invention, a malfunction due to an open-circuit condition at the DC generator output is indicated by comparing a reference frequency of the DC generator with the control frequency of the voltage regulator. Accordingly, it is possible to prevent problems such as unexpected stopping of the engine, burn out of the battery cables and fires.

I claim:

1. A malfunction detecting device for detecting an open-circuit state at an output circuit of a vehicle-mounted DC generator driven by an engine of a vehicle and including a voltage regulator, comprising: means for comparing a frequency of a signal derived from an armature winding of said DC generator and a control frequency of said voltage regulator, and indicating means responsive to an output of said comparing means for indicating a malfunction when said control frequency is equal to or greater than said frequency of said signal derived from said armature winding.

2. The malfunction indicating device as claimed in claim 1, wherein said signal derived from said armature winding is a voltage between an end point of a predetermined armature winding of said DC generator and a ground terminal of said DC generator.

3. The malfunction indicating device as claimed in claim 1, wherein said signal derived from said armature winding is a voltage between a neutral point of said armature winding and a ground terminal of said DC generator.

4. The malfunction indicating device as claimed in claim 1, wherein said comparing means comprises first and second frequency detectors having inputs coupled to said armature winding and a field winding, respectively, of said DC generator, and a microcomputer receiving outputs from said second frequency detectors.

* * * * *